(12) United States Patent
Isogai et al.

(10) Patent No.: US 6,493,927 B2
(45) Date of Patent: Dec. 17, 2002

(54) LINEAR-MOTOR-DRIVEN CHUCK AND ELECTRIC-COMPONENT MOUNTING SYSTEM

(75) Inventors: Takeyoshi Isogai, Hekinan (JP); Hiroshi Katsumi, Chiryu (JP); Masato Ando, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 76 days.

(21) Appl. No.: 09/745,442

(22) Filed: Dec. 26, 2000

(65) Prior Publication Data
US 2001/0008326 A1 Jul. 19, 2001

(30) Foreign Application Priority Data
Jan. 13, 2000  (JP) ........................................ 2000-004637

(51) Int. Cl.$^7$ ................................................. B23P 19/00
(52) U.S. Cl. ............................... 29/740; 269/8; 269/71; 269/903
(58) Field of Search ................................. 269/8, 43, 71, 269/73, 903, 218, 256; 29/740; 310/12, 13

(56) References Cited

U.S. PATENT DOCUMENTS 4,817,930 A * 4/1989 Van Deuren ................. 269/285
6,241,230 B1 * 6/2001 Kawaguchi ................. 269/285
6,354,580 B1 * 3/2002 Nagai et al. ................. 269/225

FOREIGN PATENT DOCUMENTS

JP          6-93559          11/1994

\* cited by examiner

*Primary Examiner*—Robert M. Fetsuga
*Assistant Examiner*—Peter deVore
(74) *Attorney, Agent, or Firm*—Oliff & Berridge, PLC

(57) ABSTRACT

A chuck for holding an object, including one or more linear motors which include one or more linear stators, two or more moving members which are movable along the linear stator or stators, independent of each other, and one or more guide members which guide each of the two or more moving members along the linear stator or stators, and two or more holding members which are supported by the two or more moving members, respectively, and which cooperate with each other to hold the object.

15 Claims, 11 Drawing Sheets

LINEAR-MOTOR-DRIVEN CHUCK AND ELECTRIC-COMPONENT MOUNTING SYSTEM

BACKGROUND OF THE INVENTION

1. Field of the Invention

The present invention relates to a chuck which holds an object such as an electric component and also to an electric-component mounting system which mounts an electric component on a circuit substrate such as a printed wiring board.

2. Discussion of Related Art

There is known an electric-component (EC) mounting system which includes a chuck for holding an electric component (EC) and moves the chuck holding the EC to a circuit substrate to mount the EC on the substrate and thereby produce an electric circuit. The conventional chuck includes a pair of holding jaws, and an opening and closing device for mechanically opening and closing the jaws by moving the jaws symmetrically with respect to the center of the chuck. Thus, the chuck can hold the EC such that the center of the EC is aligned with that of the chuck.

However, the conventional chuck including the mechanical opening and closing device cannot largely change the respective positions of the holding jaws because of the mechanical structure of the opening and closing device. Therefore, the conventional chuck cannot hold different sorts of ECs having largely different sizes. In addition, the chuck cannot hold an EC having an asymmetric shape such that a desired portion of the EC is aligned with the centerline of the chuck.

While the above discussion relates to the chuck for holding the EC, the same problems as indicated above occur to other sorts of chucks for holding other sorts of objects.

SUMMARY OF THE INVENTION

The present invention provides a linear-motor-driven chuck and an electric-component mounting system which have one or more of the following technical features that are described below in respective paragraphs given parenthesized sequential numbers (1) to (13). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a chuck for holding an object, comprising at least one linear motor which includes at least one linear stator, two moving members which are movable along the linear stator, independent of each other, and at least one guide member which guides each of the two moving members along the linear stator; and two holding members which are supported by the two moving members, respectively, and which cooperate with each other to hold the object.

The linear motor may include a single linear stator common to the two moving members, or two linear stators for the two moving members, respectively. In the former case, each one of the two moving members may be moved over the middle or center of the single linear stator, toward the other moving member. In the latter case, the linear motor can be said as two linear motors each of which includes a corresponding one of the two linear stators and a corresponding one of the two moving members.

In the present chuck, the two holding members are supported by the two moving members of the linear motor that are movable independent of each other. Therefore, the distance between the two holding members can be largely changed more easily than the conventional chuck including the mechanical opening and closing device. Thus, the present chuck can hold various sorts of objects in a wider range. The two holding members may be two external holding members which externally engage an outer surface or surfaces of an object and thereby hold it, or two internal holding members which engage an inner surface or surfaces of an object having an inner space and thereby hold it.

(2) According to a second feature of the present invention that includes the first feature (1), the chuck further comprises a rotating device which rotates the linear motor about an axis line perpendicular to a lengthwise direction of the linear stator.

Since the present chuck includes the chuck rotating device which rotates the linear motor, the chuck can change the current angular phase of the object (e.g., electric component, EC) held by the two holding members, to any desirable angular phase. For example, the chuck can change the current angular phase of an EC to a prescribed angular phase thereof relative to a circuit board, before the EC is mounted on the board.

(3) According to a third feature of the present invention that includes the first or second feature (1) or (2), each of the two moving members comprises an attaching member to which a corresponding one of the two holding members is detachably attached.

Since the two holding members are detachably attached to the respective attaching members of the two moving members, the current sort of holding members may be replaced with a new sort of holding members, depending upon the sort of new objects to be held next by the chuck. Thus, the present chuck can hold various sorts of objects in a wider range.

(4) According to a third feature of the present invention that includes any one of the first to third features (1) to (3), the chuck further comprises two position sensors each of which detects a current position of a corresponding one of the two moving members and produces a detection signal indicating the detected current position of the one moving member.

Since the two position sensors detect the respective current positions of the two moving members, a control device, for example, which may be employed and connected to the linear motor can more accurately control, based on the detected current positions, the respective current positions of the two moving members of the linear motor. This contributes to improving a positioning accuracy with which the chuck holds the object.

(5) According to a fifth feature of the present invention that includes any one of the first to fourth features (1) to (4), the chuck further comprises two origin sensors each of which detects a corresponding one of the two moving members which is currently positioned at an origin position thereof.

Since the two origin sensors detect the two moving members being currently positioned at their origin positions, the above control device can control, based on the detected origin positions, the respective movements of the two moving members of the linear motor. This contributes to facilitating the control to open and close the chuck.

(6) According to a sixth feature of the present invention that includes the fourth or fifth feature (4) or (5), the chuck further comprises a control device including a symmetric-movement control portion which controls, based on the respective detection signals produced by the two position sensors, the linear motor to move the two moving members symmetrically with respect to a centerline of the chuck.

The present chuck can hold an object symmetric with respect to a plane, in a state in which the plane contains a centerline of the chuck.

(7) According to a seventh feature of the present invention that includes any one of the fourth to sixth features (4) to (6), the chuck further comprises a control device including an asymmetric-movement control portion which controls, based on the respective detection signals produced by the two position sensors, the linear motor to move the two moving members asymmetrically with respect to a centerline of the chuck.

The present chuck is suitable for holding an asymmetric object.

(8) According to an eighth feature of the present invention that includes any one of the fourth to seventh features (4) to (7), the chuck further comprises a control device including an object-dependent control portion which controls, based on the respective detection signals produced by the two position sensors, the linear motor to move the two moving members to respective opened positions where the two holding members supported by the two moving members are distant from each other by a distance greater than a prescribed dimension of the object by a predetermined distance and then move the two moving members toward each other at respective speeds equal to each other.

The present chuck can hold, or release, the object in a short time, and can position, and hold, the object at a desired position.

(9) According to a ninth feature of the present invention that includes any one of the first to eighth features (1) to (8), the chuck further comprises a control device including a holding-force control portion which controls a holding force with which the two holding members hold the object.

The present chuck can hold, with an appropriate holding force, an object which is easily deformable or highly fragile.

(10) According to a tenth feature of the present invention that includes any one of the first to ninth features (1) to (9), the chuck comprising two linear motors one of which includes two first moving members that are movable toward, and away from, each other in a first direction and the other of which includes two second moving members that are movable toward, and away from, each other in a second direction perpendicular to the first direction, and the first and second moving members cooperate with each other to hold the object in the first and second directions.

The present chuck can more reliably hold the object and, in particular, it is advantageous for holding an object having a shape asymmetric with respect to both of two planes which are respectively perpendicular to the first and second directions.

(11) According to an eleventh feature of the present invention, there is provided a system for mounting at least one electric component on a circuit substrate, comprising a chuck according to any one of the first to tenth features (1) to (10); a chuck moving device which moves the chuck to an arbitrary position in a movement area parallel to a substantially horizontal plane; a supplying device which is provided in the movement area and which supplies the electric component to the chuck; and a supporting device which is provided in the movement area and which supports the circuit substrate on which the electric component is to be mounted by the chuck.

Since the present EC mounting system employs the chuck which can hold various sorts of objects in a wide rage as described above, the mounting system enjoys a high degree of freedom in the meaning that it can mount various sorts of ECs on a circuit substrate.

(12) According to a twelfth feature of the present invention that includes the eleventh feature (11), the mounting system further comprises a chuck elevating and lowering device which elevates and lowers the chuck in respective directions perpendicular to the substantially horizontal plane.

Since the present EC mounting system includes the chuck elevating and lowering device which elevates and lowers the chuck, the mounting system can lower and elevate the chuck to take an EC from the EC supplying device and/or mount the EC on the circuit substrate. Therefore, the present mounting system need not lower or elevate the EC supplying device or the substrate supporting device to take out the EC from the supplying device or mount the EC on the circuit substrate supported by the supporting device. Thus, the overall construction of the EC mounting system can be simplified.

(13) According to a thirteenth feature of the present invention that includes the eleventh or twelfth feature (11) or (12), the mounting system further comprises an image taking device which takes an image of the electric component held by the chuck; and a modifying device which determines, based on image data representing the image taken by the image taking device, at least one positional error of the electric component held by the chuck and modifies, based on the determined positional error, at least one movement amount of the chuck moving device so as to move the chuck to a position where the positional error of the electric component is zero relative to the circuit substrate supported by the supporting device.

In the case where the EC held by the chuck has at least one positional error (e.g., a horizontal-position error in an X-axis direction or a Y-axis directioin, and/or an angular-phase error about a Z axis perpendicular to the X and Y axes), the present EC mounting system can mount the EC on the circuit substrate after correcting the positional error or errors. Thus, the present mounting system enjoys a high accuracy with respect to the position or positions at which the system mounts the EC on the circuit substrate. However, as described above, the chuck can enjoy a high accuracy with respect to the position or positions at which the chuck holds the EC. In the latter case, the image taking device and the modifying device may be omitted, and the chuck according to the tenth feature (10) is particularly advantageous. According to the combination of the thirteenth and tenth features (13) and (10), the EC mounting system may employ, in place of the modifying device, a correcting device which determines, based on the image data representing the image taken by the image taking device, one or more positional errors of the EC held by the two pairs of moving members and corrects, based on the determined positional error or errors, the erroneous position or positions of the EC, by correcting the respective current positions of the two pairs of moving members. In the last case, it is preferred that each pair of moving members which are moved toward, and away from, each other in first directions be moved by a small distance in each of second directions perpendicular to the first directions, and be biased toward respective neutral positions thereof by respective biasing members such as elastic members. In this case, when the respective current positions of the one or first pair of moving members are corrected by moving those members, the other or second pair of moving members follow the movement of the first pair of moving members.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF PROFFERED EMBODIMENT

Figure 1:
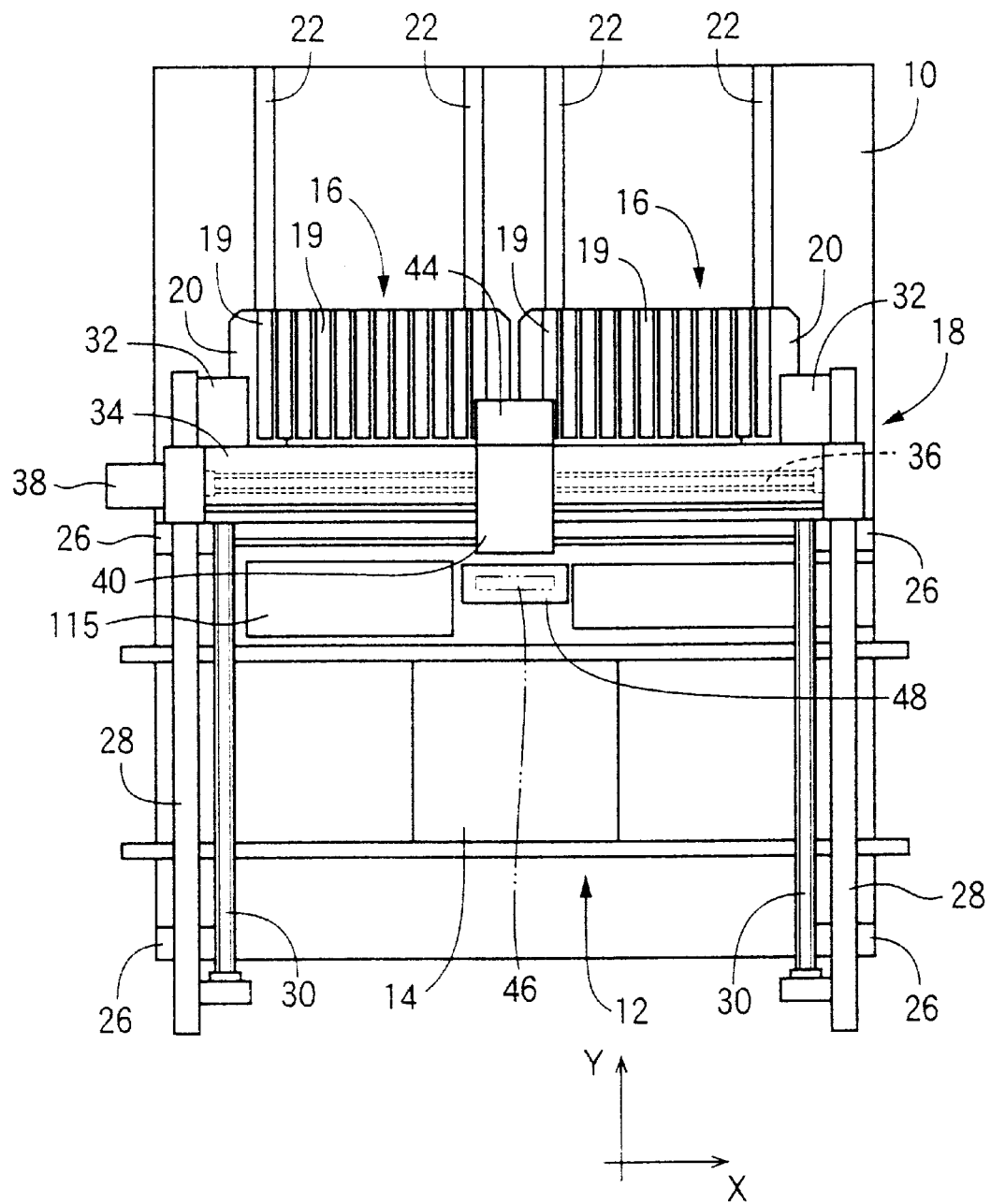
FIG. 1 is a schematic plan view of an electric-component (EC) mounting system to which the present invention is applied.

FIG. 1 is a plan view of an electric-component (EC) mounting system to which the present invention is applied. The present EC mounting system includes a base 10; and a board conveyor 12, two EC supplying devices 16 and an EC mounting device 18 which are provided on the base 10. The board conveyor 12 conveys a printed wiring board 14 as a circuit substrate, and positions and supports the board 14 at a predetermined EC-mount station. Thus, the board conveyor 12 also functions as a circuit-substrate supporting device. Each of the two EC supplying devices 16 includes a feeder table 20, and a plurality of EC feeders 19 which are detachably attached to the feeder table 20 such that respective EC-supply portions of the feeders 19 are arranged along a straight line parallel to an X-axis direction. Each of the EC feeders 19 stores a number of electric components (ECs) of one sort, and supplies the ECs, one by one, from the EC-supply portion thereof. Each of the two feeder tables 20 is movable, while being guided by a pair of guide rails 22, between an EC-supply position and a retracted position in a Y-axis direction perpendicular to the X-axis direction.

The EC mounting device 18 includes an X-Y moving device, which includes four columns 26 which stand on the base 10; two guide rails 28 which are horizontally supported by the columns 26 such that the guide rails 28 extend parallel to the Y-axis direction; two feed screws 30; two Y-axis motors (servomotors) 32; a Y-axis slide 40 which is provided with two nuts (not shown) threadedly engaged with the two feed screws 30, respectively, and is moved in the Y-axis direction by the screws 30 and the motors 32 while being guided by the guide rails 28; a feed screw 36; an X-axis motor (servomotor) 38; and an X-axis slide 40 which is provided, together with the feed screw 36 and the X-axis motor 38, on the Y-axis slide 40 and is moved in the X-axis direction by the screw 36 and the motor 38.

The X-axis slide 40 supports an EC holding head 44 which receives an EC 134 (FIG. 2) from an appropriate one of the two EC supplying devices 16, and conveys the EC 134 to a position above the printed board 14 positioned and supported by the board conveyor 12, along an EC-convey path below which an image taking device 48 including a line image sensor 46 is provided.

Figure 2:
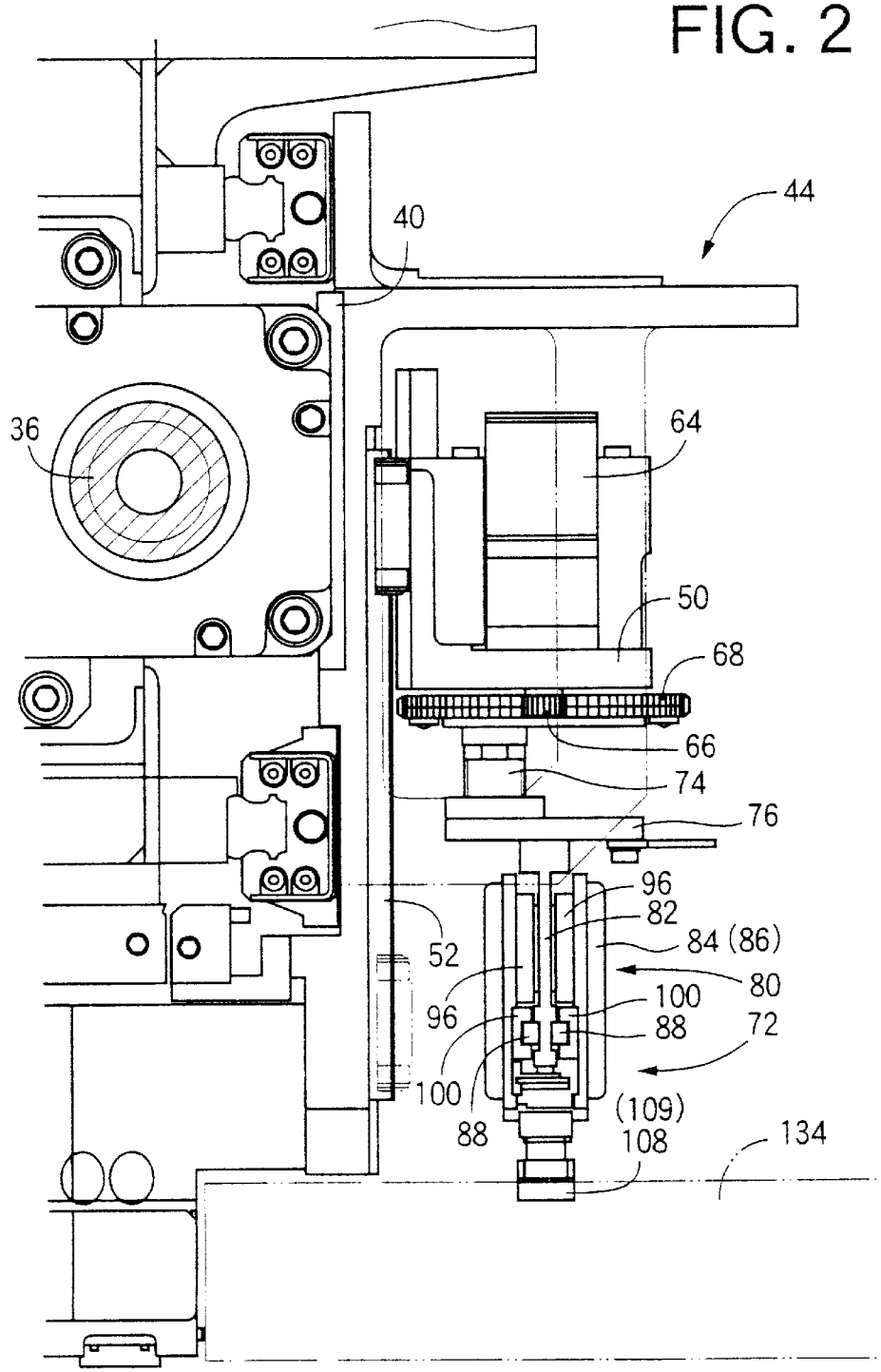
FIG. 2 is a side elevation view of a linear-motor-driven chuck and its vicinity of the EC mounting system.
Figure 3:
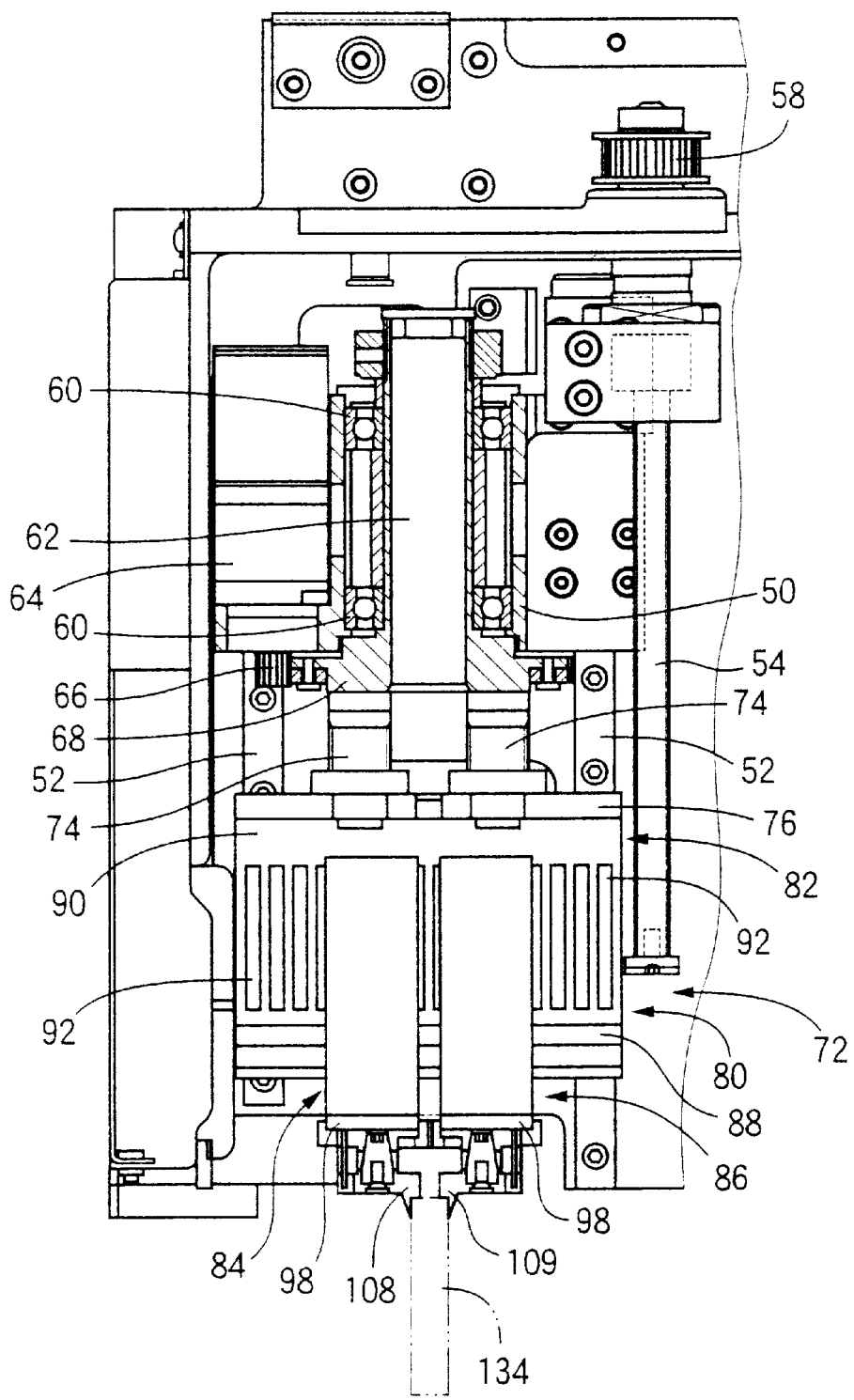
FIG. 3 is a front elevation view of the linear-motor-driven chuck and its vicinity of the EC mounting system.
Figure 4:
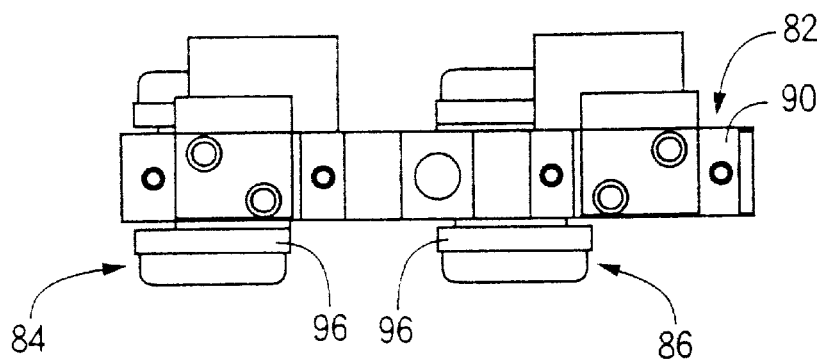
FIG. 4 is a plan view of the linear-motor-driven chuck.
Figure 5:
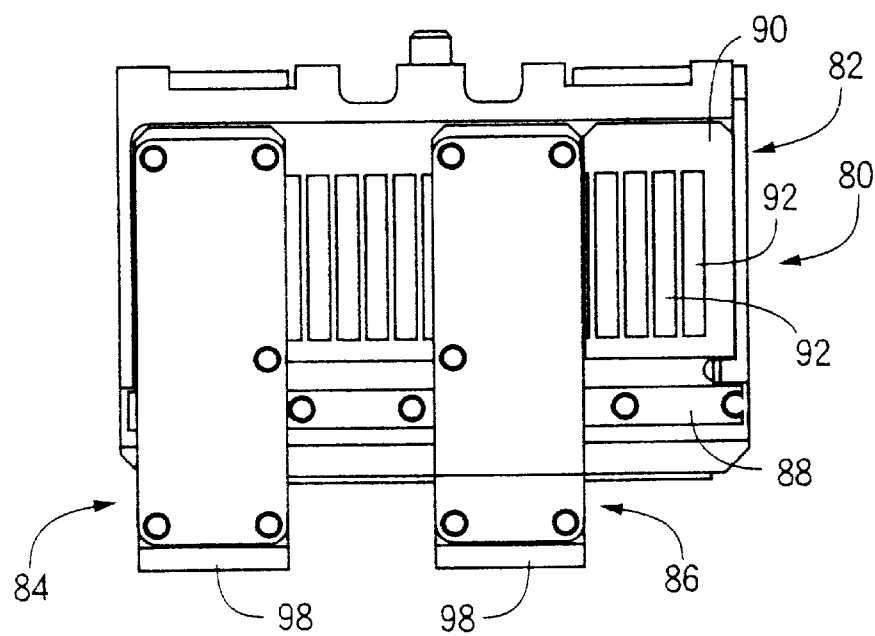
FIG. 5 is a front elevation view of the linear-motor-driven chuck.
Figure 6:
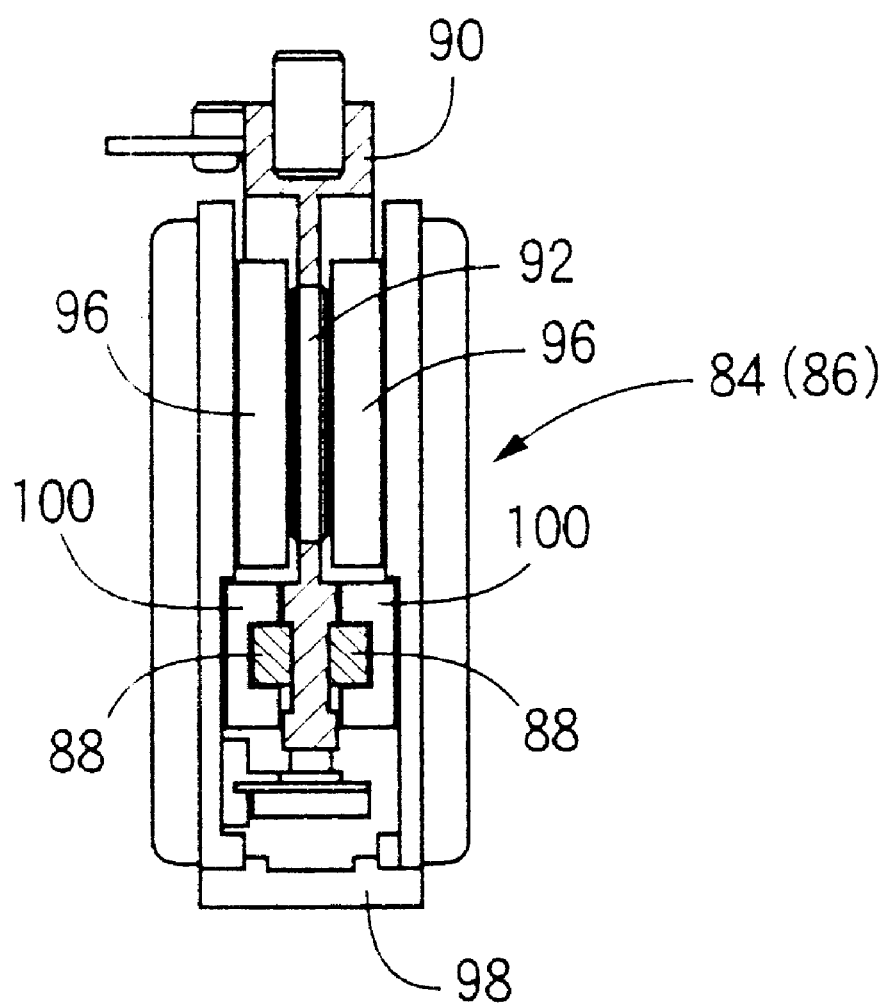
FIG. 6 is a cross-sectioned, side elevation view of the linear-motor-driven chuck.
Figure 8:
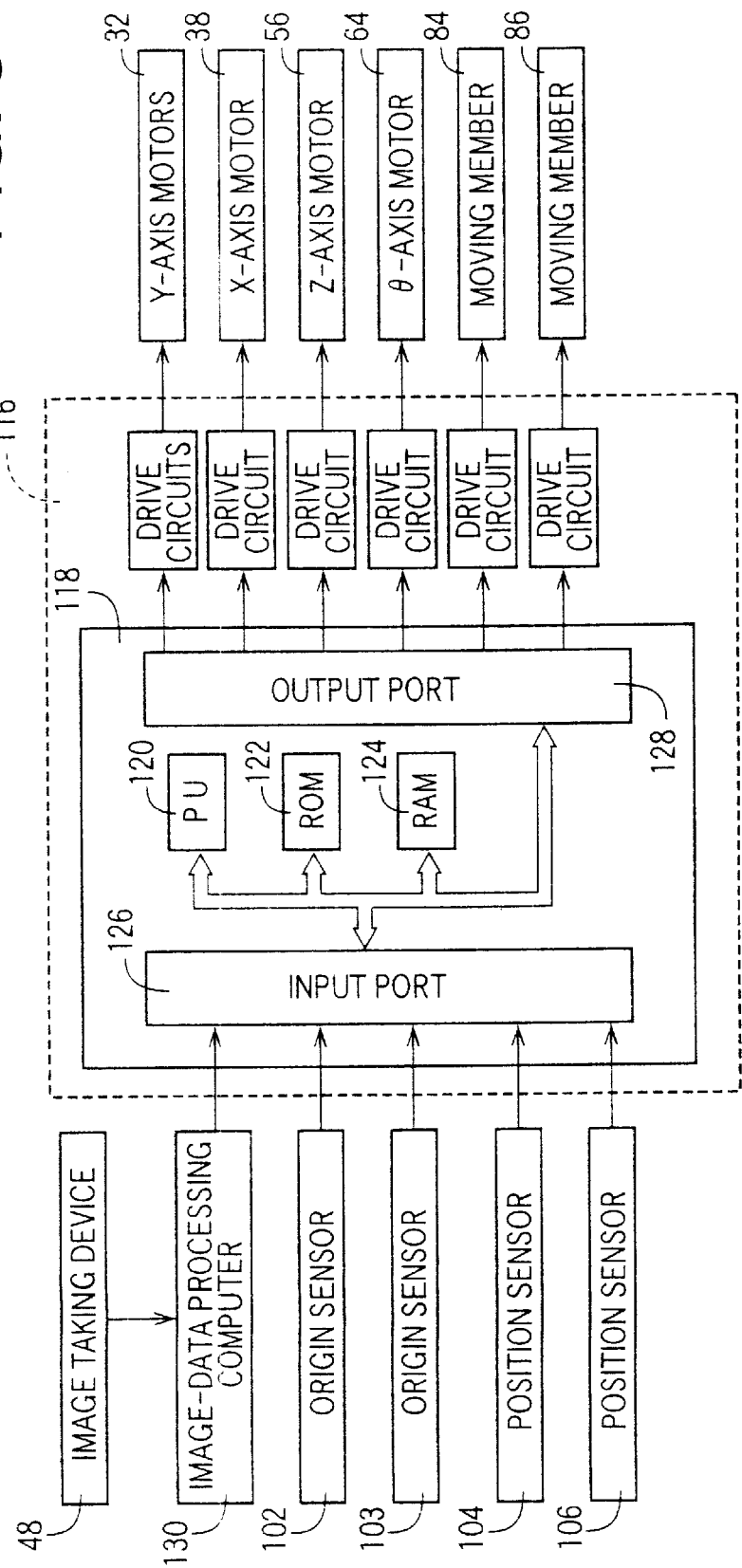
FIG. 8 is a diagrammatic view of a control device of the EC mounting system.

As shown in FIGS. 2 and 3, the EC holding head 44 includes an elevator member 50, as a main member thereof, that is supported by the X-axis slide 40 such that the elevator member 50 is movable upward and downward. The elevator member 50 is moved up and down by a feed screw 54 and a Z-axis motor (servomotor; FIG. 8) 56 while being guided by a pair of guide rails 52 provided on the X-axis slide 40. Reference numeral 58 designates a timing pulley as a transmitting device which transmits the rotation of the Z-axis motor 56 to the feed screw 54. The elevator member 50 supports a rotatable shaft 62 via bearings 60 such that the rotatable shaft 62 is rotatable about a vertical axis line thereof relative to the elevator member 50 and is not movable in directions parallel to the axis line relative to the same 50. The rotatable shaft 62 is rotated by a θ-axis motor (servomotor) 64 via a pinion 66 and a gear (scissors gear) 68.

A main portion of the gear 68 is integral with a lower end portion of the rotatable shaft 62. A linear-motor-driven chuck 72 as an EC holder is detachably attached to the main portion of the gear 68. More specifically described, an attaching member 76 is fixed to the main portion of the gear 68 via two connecting rods 74, and a stator 82 of a linear motor 80 as a main member of the chuck 72 is detachably attached to the attaching member 76. The linear motor 80 is a linear DC brushless motor, and includes, in addition to the above-indicated stator 82, two moving members 84, 86, and two guide members 88 for guiding the moving members 84, 86 in directions parallel to a lengthwise direction of the stator 82.

The stator 82 includes a main portion 90 which is formed of an aluminum alloy as a non-magnetic material, and a number of permanent magnets 92 which are fixed to the main portion 90. Each of the permanent magnets 92 has an elongate shape like a square bar, and one of opposite elongate side surfaces thereof has a north pole (N-pole) and the other long side surface has a south pole (S-pole). The main portion 90 supports the magnets 92 such that the N-poles and the S-poles are alternate with each other in the lengthwise direction of the stator 82. The N-pole and S-pole side surfaces of each magnet 92 somewhat project from opposite side surfaces of the main portion 90. The N-poles (or S-poles) on one of the opposite side surfaces of the main portion 90 and the N-poles (or S-poles) on the other side surface of the main portion 90 provide a zigzag pattern in a plan view.

Each of the two moving members 84, 86 includes two iron cores 96 which face the opposite two side surfaces of the main portion 90 of the stator 82, respectively. Respective lower end portions of the two cores 96 are connected to each other by a connecting table 98. Thus, each of the moving members 84, 86 has a generally U-shaped cross section. A U-phase coil, a V-phase coil, and a W-phase coil are wound around each core 96 to provide a coil unit. Each of the two coil units is designed such that under control of an electric current supplied to a corresponding one of the two moving members 84, 86, the each coil unit produces a force to linearly move the one moving member 84, 86 along the stator 82 owing to the interaction between the magnetic force produced by the each coil and the respective magnetic forces of the permanent magnets 92 of the stator 82.

The respective movements of the two moving members 84, 86 are guided by the two guide members 88 fixed to the opposite side surfaces of the main portion 90 of the stator 82. Two sliders 100 are fixed to opposed inner surfaces of each of the U-shaped moving members 84, 86, respectively, and are engaged with the two guide members 88, respectively, via balls (not shown). Thus, each of the moving members 84, 86 is lightly moved along the guide members 88.

Respective origin positions of the two moving members 84, 86 correspond to respective lengthwise opposite ends of the stator 82. Two origin sensors 102, 103 (FIG. 8) detect that the two moving members 84, 86 are positioned, or not positioned, at their origin positions, respectively. Two position sensors 104, 106 (FIG. 8) detect respective positions of the two moving members 84, 86 as respective distances thereof as measured from the respective origin positions. In the present embodiment, each of the origin sensors 102, 103 is provided by a transmission-type photoelectric sensor which includes a light emitting diode (LED) as a light emitter; a light receiver or detector for detecting a light emitted by the LED; and a shielding member which is provided on a corresponding one of the moving members 84, 86 and which shields, when the one moving member 84, 86 is positioned at its origin position, the light emitted by the LED and prevents the light from being detected by the light detector. However, the transmission-type photoelectric sensor may be replaced with a different sort of sensor, such as a reflection-type photoelectric sensor, a contact-type switch (e.g., a limit switch), or a proximity switch. In the present embodiment, each of the position sensors 104, 106 is provided by a magnetic linear scale ("Magnescale") including a magnetic scale having magnetic graduations and a magnetic-field detecting head which is moved on the magnetic scale while producing an electric signal indicating the current position of a corresponding one of the moving members 84, 86. However, the magnetic linear scale may be replaced with an optical linear scale or a different sort of position sensor. The two position sensors 104, 106 may employ a single common magnetic scale.

Figure 7:
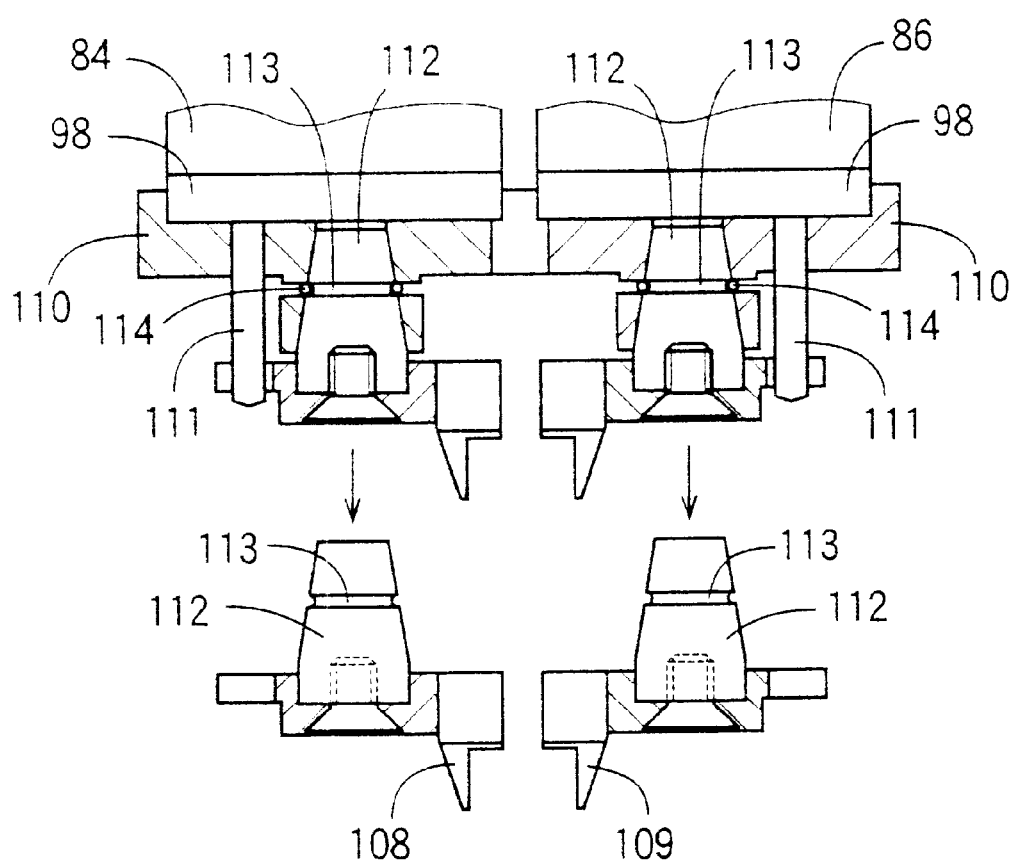
FIG. 7 is a view for explaining the manner in which two holding jaws are detached from two moving members of the linear-motor-driven chuck.

A pair of holding jaws 108, 109 which cooperate with each other to sandwich and hold the EC 134 are detachably attached to the respective tables 98 of the two moving members 84, 86. In the present embodiment, a jaw storing device 115 (FIG. 1) stores a plurality of holding jaws 108, 109 of different sorts. The current pair of jaws 108, 109 can be replaced with a pair of jaws 108, 109 of a different sort, depending upon the sort of new ECs to be mounted by the EC holding head 44. As shown in the enlarged view of FIG. 7, each of the two tables 98 supports an attaching member 110 and a positioning pin 111, and each of the holding jaws 108, 109 includes a tapered shank 112 having an annular groove 113. In the state in which the tapered shank 112 of each jaw 108, 109 is fitted in a tapered hole of the attaching member 110, two arm portions of a U-shaped holding spring 114, supported by the attaching member 110, elastically engage the annular groove 113 of the tapered shank 112. Thus, each jaw 108, 109 is prevented from coming off the attaching member 110. In addition, the positioning pin 111 fits in a positioning recess formed in each jaw 108, 109, thereby preventing each jaw 108, 109 from being rotated about its tapered shank 112. Thus, each jaw 108, 109 is secured to the corresponding moving member 84, 86, such that the each jaw 108, 109 is not movable relative to the corresponding moving member 84, 86.

The present EC mounting system automatically replaces the current pair of holding jaws 108, 109 with another pair of holding jaws 108, 109 which are stored in the jaw storing device 115, which is provided between the EC supplying devices 16 and the board conveyor 12, as shown in FIG. 1. When the replacement of the current jaws 108, 109 is needed, first, the EC holding head 44 is moved to a position above the jaw storing device 115, then the chuck 72 is moved down toward the device 115, subsequently a movable member of the device 115 is moved and engaged with the current jaws 108, 109, and the chuck 72 is moved up, so that the current jaws 108, 109 are removed from the chuck 72 and are stored in the device 115. The attachment of new jaws 108, 109 is carried out in an order opposite to the order of description. Since the jaw storing device 115 is not relevant to the present invention, no detailed description and illustration are provided. In short, in the present embodiment, each jaw 108, 109 can be attached to, and detached from, the attaching member 110 by just applying a force greater than a threshold value, to the each jaw 108, 109 in an axial direction of the tapered shank 112 thereof. Thus, the current jaws 108, 109 can be easily exchanged with different jaws 108, 109.

Figure 10:
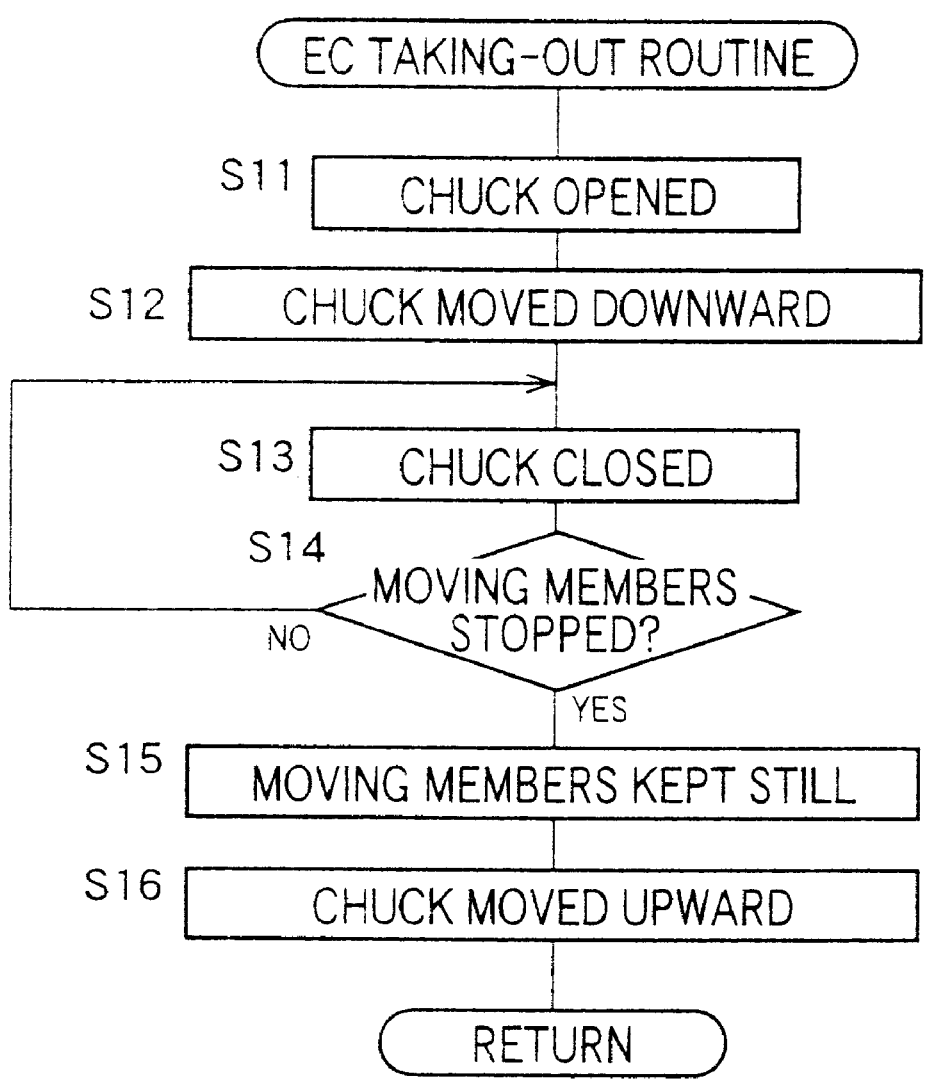
FIG. 10 is a flow chart showing detailed steps of Step S3 of the flow chart of FIG. 9.
Figure 11:
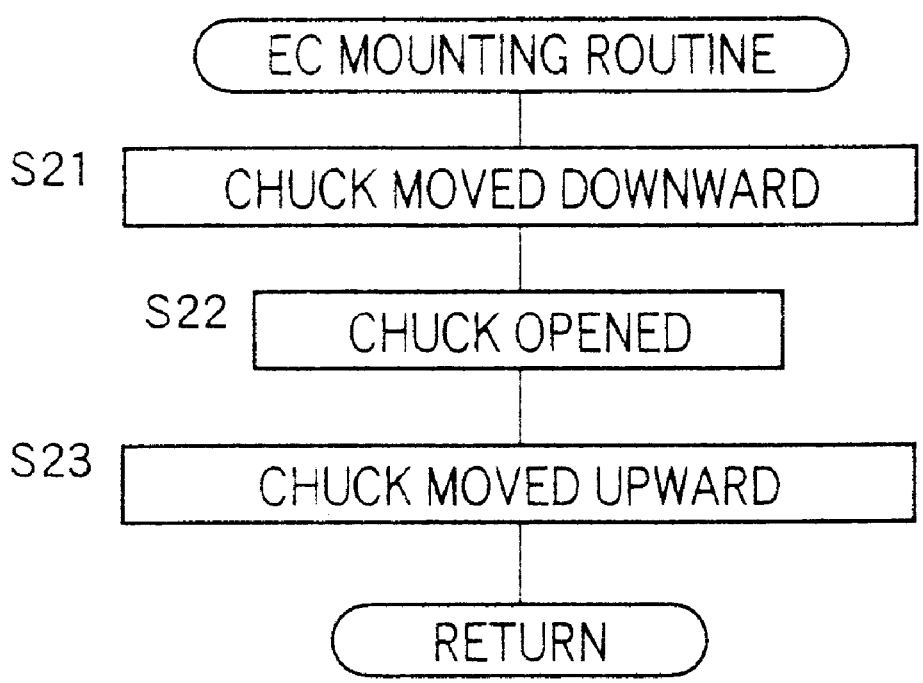
FIG. 11 is a flow chart showing detailed steps of Step S7 of the flow chart of FIG. 9.

The present EC mounting system is controlled by a control device 116 shown in FIG. 8. However, FIG. 8 shows only portions of the EC mounting system that are relevant to the present invention. The control device 116 is essentially provided by a computer 118 including a processing unit (PU) 120, a read only memory (ROM) 122, a random access memory (RAM) 124, an input port 126, an output port 128, and a bus line for connecting those elements 120, 122, 124, 126, 128 to one another. An image-data processing computer 130 which processes image data representing the image taken by the image taking device 48, is connected to the input port 126. In addition, the origin sensors 102, 103, the position sensors 104, 106, other sensors, and other computers are also connected to the input port 126. The output port 128 is connected via respective drive circuits to the Y-axis motors 32, the X-axis motor 38, the Z-axis motor 56, the θ-axis motor 64, and the two moving members 84, 86 of the chuck 72. The ROM 122 stores various control programs including an electric-circuit assembling routine represented by the flow charts shown in FIGS. 9 to 11. According to the electric-circuit assembling routine, the control device 116 controls the EC mounting system to automatically mount the ECs 134 on the printed wiring board 14 and thereby assemble an electric-circuit board 14. Hereinafter, there will be described the electric-circuit assembling operation which is carried out by the present EC mounting system.

After the board conveyor 12 positions the printed wiring board 14 at the predetermined position shown in FIG. 1, the control device 116 starts with Step S1 to read out, from the RAM 124, control data relating to a current EC 134 which is to be mounted next on the printed board 14. This control data include identification (ID) data identifying the sort of current EC, a take-out position where the EC holding head 44 or the chuck 72 takes out the current EC 134 of that sort from one of the EC feeders 19 of the EC supplying devices 16, and a mount position where the chuck 72 mounts the current EC 134 on the printed board 14. Step S1 is followed by Step S2 where the control device 116 moves the chuck 72 to the take-out position, and then by Step S3 where the control device 116 carries out an EC taking-out routine represented by the flow chart of FIG. 10. First, at Step of FIG. 10, the control device 116 opens the chuck 72. More specifically described, the control device 116 reads out, based on the ID data identifying the sort of current EC 134, distance data indicating respective prescribed distances of respective portions of the EC 134 that are to be held by the two holding jaws 108, 109, from a reference position, i.e., the centerline of the chuck 72. Then, the control device 116 opens each of the two moving members 84, 86 to position a corresponding one of the two holding jaws 108, 109 at a position which is more distant from the reference position than a corresponding one of the read-out prescribed distances by a predetermined distance.

The reference position, i.e., the centerline of the chuck 72 coincides with the axis line of rotation of the rotary shaft 62 in the state in which the chuck 72 is attached to the attaching member 76. In the case where the EC 134 is one which has a plane-symmetric shape with respect to at least a first plane perpendicularly intersecting the direction in which the two holding jaws 108, 109 are moved toward, and away from, each other, the two jaws 108, 109 of the chuck 72 are opened symmetrically with respect to a second plane including the axis line of rotation of the rotatable shaft 62. On the other hand, in the case where the EC 134 is one which has an asymmetric shape with respect to the above-indicated first plane, the two jaws 108, 109 are opened asymmetrically with respect to the above-indicated second plane. Thus, in the present embodiment, a portion of the control device 116 that carries out Step S11 provides an object-dependent control portion. The same portion of the control device 116 provides a symmetric-movement control portion in the case where the EC 134 is plane-symmetric, and provides an asymmetric-movement control portion in the case where the EC 134 is asymmetric.

After the chuck 72 is opened in this way, the control of the control device 116 goes to Step S12 where the control device 116 controls the Z-axis motor 56 to move the elevator member 56 downward to a height position where the chuck 72 can hold the current EC 134. Step S12 is followed by Steps S13 to S16 to close the chuck 72 and thereby hold the EC 134. The EC 134 indicated at two-dot chain line in FIG. 3 is the thinnest one of a plurality of sorts of ECs which can be held by the chuck 72. Since the chuck 72 can be largely opened, the chuck 72 can hold an EC having a thickness equal to more than several times the thickness of the EC 134. The EC 134 can have, in a direction perpendicular to the direction in which the EC 134 is held by the chuck 72, such a dimension as indicated at two-dot chain line in FIG. 2. Since the elevator member 50 or the chuck 72 can be largely elevated and lowered, the EC 134 is allowed to have a height (i.e., a vertical dimension) which can change in a wide range.

The current EC 134 is fed to, and positioned at, a prescribed position by one of the EC feeders 19 of the EC supplying devices 16. Therefore, in a state in which the chuck 72 being opened has been moved down, the two holding jaws 108, 109 are horizontally distant from respective outer surfaces of the EC 134 by respective small distances equal to each other. Then, the chuck 72 is closed by moving the two moving members 84, 86 at respective speeds equal to each other. When the two holding jaws 108, 109 contact the respective outer surfaces of the EC 134, the moving members 84, 86 are stopped because they cannot be moved any more. The holding force with which the two jaws 108, 109 hold the EC 134 is controlled at an appropriate force by the control device 116 by controlling, based on the ID data indicating the sort of current EC 134 read out at Step S1, the respective electric currents supplied to the respective coil units of the two moving members 84, 86. The above appropriate force is appropriate for the current EC 134 in the meaning that that force is not so great as to break the EC 134 or so small as to fail to hold the same 134. If the two moving members 84, 86 are thus stopped, a positive judgment is made at Step S14, and the control goes to Step S15 to keep still the two moving members 84, 86. More specifically described, the control device 116 controls the respective electric currents supplied to the respective coil units of the two moving members 84, 86, such that the two holding jaws 108, 109 hold the EC 134 with the appropriate force and such that the two moving members 84, 86 are not moved from the respective stopped positions. For example, if the first member 84 applies, to the EC 134, a force somewhat greater than that applied by the second member 86, then the two members 84, 86 holding the EC 134 move rightward in FIG. 3, which is detected by the position sensors 104, 106. Therefore, the control device 116 decreases the electric current supplied to the coil unit of the first moving member 84, or increases the electric current supplied to the coil unit of the second moving member 86, so that the two members 84, 86 holding the EC 134 are moved leftward. Whether the control device 116 should decrease the first current supplied to the first member 84 or increase the second current supplied to the second member 86 depends on which one of decreasing the first current or increasing the second current is more appropriate for producing the appropriate holding force. In this way, the control device 116 controls the two moving members 84, 86 to hold the EC 34 with the appropriate holding force and to be kept still at the respective stopped positions. In this state, the control device 116 carries out Step S16 to move the chuck 72 upward and thus take out the EC 134 from the EC supplying devices 16.

After the EC 134 is thus taken out, the control of the control device 116 goes to Step S4 to move the chuck 72 to an image-take-start position, and then to Step S5 to control the image taking device 48 to take an image of the EC 134 held by the chuck 72. In the present embodiment, the image taking device 48 includes the line-image sensor 46 which includes an array of CCDs (charge coupled devices). Therefore, when the chuck 72 is moved at a prescribed speed from the image-take-start position in the Y-axis direction, the line-image sensor 46 iteratively takes respective line images of the EC 134 at respective predetermined intervals of time, so that image data representing an image of the entirety of EC 134 as a group of the line images are obtained by the image taking device 48. The image-data processing computer 130 compares the thus obtained image data with correct image data, pre-stored in the RAM 124, representing a correct image of EC 134 which is correctly held by the chuck 72, i.e., at respective correct positions in the X-axis and Y-axis directions and at a correct angular phase (or rotation position) about the Z-axis direction. Consequently the computer 130 calculates respective positional errors, $\Delta X$, $\Delta Y$, of a reference position of the EC 134 from the respective correct positions in the X-axis and Y-axis directions, and an angular-phase error, $\Delta \theta$, of the EC 134 about a straight line which passes through the reference position, parallel to the Z-axis direction, i.e., perpendicularly to the X-axis and Y-axis directions. The image-data processing computer 130 supplies error data representing the thus calculated errors $\Delta X$, $\Delta Y$, $\Delta \theta$ to the control device 116 or the computer 118.

After the image of the EC 134 is taken at Step S5, the control device 116 moves the chuck 72 to the mount position indicated by the control data read out at Step S1. During this movement of the chuck 72, the image-data processing computer 130 supplies the error data representing the errors $\Delta X$, $\Delta Y$, $\Delta \theta$ to the control device 116. Consequently the control device 116 stops the chuck 72 at respective X-axis-direction and Y-axis-direction positions and an angular phase which have been obtained by modifying, by the errors $\Delta X$, $\Delta Y$, $\Delta \theta$, the correct or nominal X-axis-direction and Y-axis- direction positions and the correct angular phase. Step S6 is followed by Step S7 to carry out an EC mounting routine represented by the flow chart of FIG. 11. At Step S21 of FIG. 11, the control device 116 moves the chuck 72 downward to press the EC 134 against the printed wiring board 14 and temporarily fix the same 134 with an adhesive which has already been applied to the board 14. Step S21 is followed by Step S22 to open the chuck 72, and then by Step S23 to move the chuck 72 upward.

Figure 9:
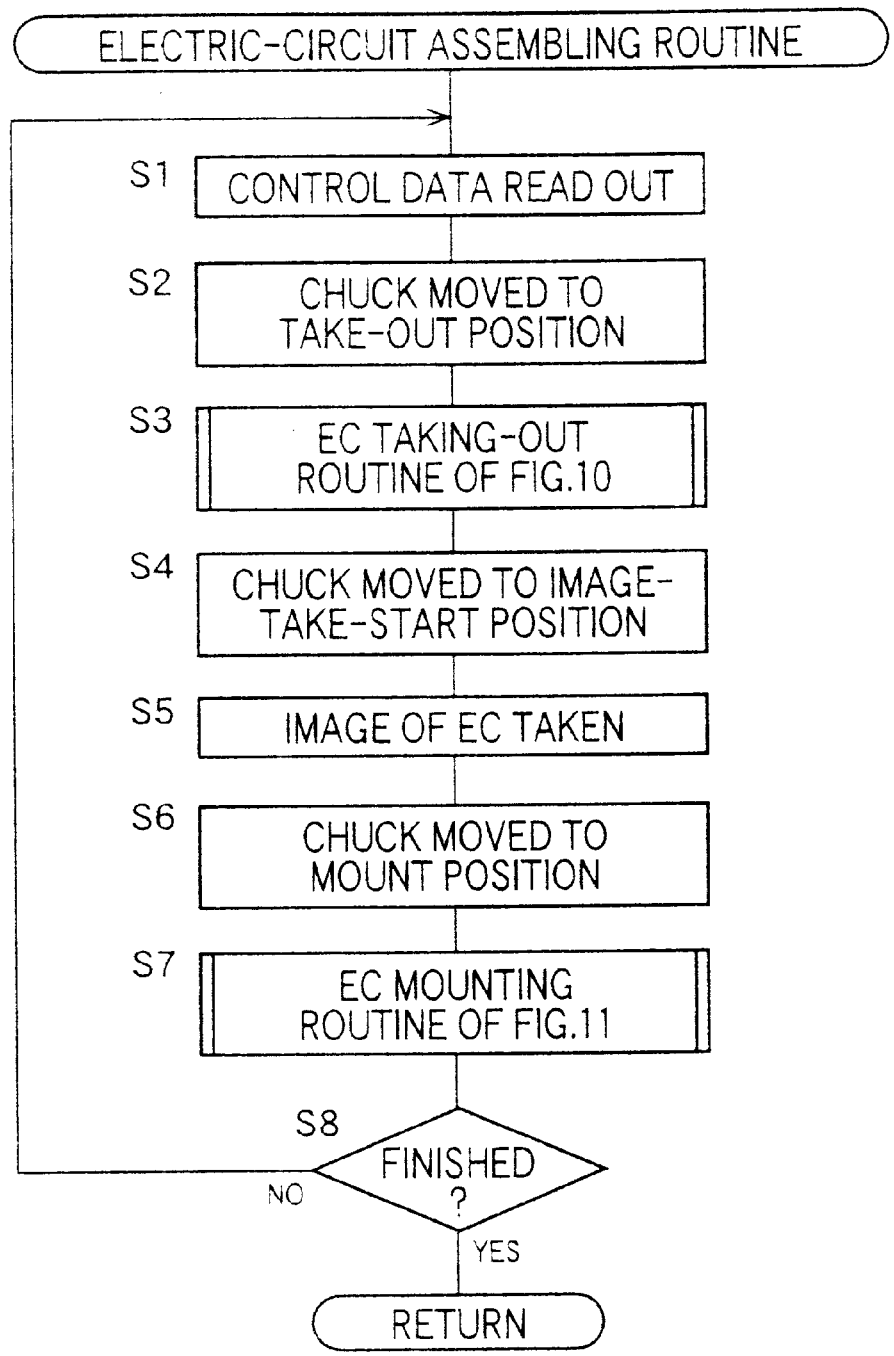
FIG. 9 is a flow chart representing an electric-circuit assembling routine as one of control programs according to which the control device controls the EC mounting system.

After the current EC 134 has been mounted on the printed wiring board 14, the control goes to Step S8 of FIG. 9 to judge whether all the ECs 134 to be mounted on the board 14 have been mounted on the board 14. If a negative judgment is made at Step S8, the control device 116 repeats Step S1 and the following steps. Meanwhile, if a positive judgment is made at Step S8, the current control cycle according to the electric-circuit assembling routine of FIG. 9 is finished.

Figure 12:
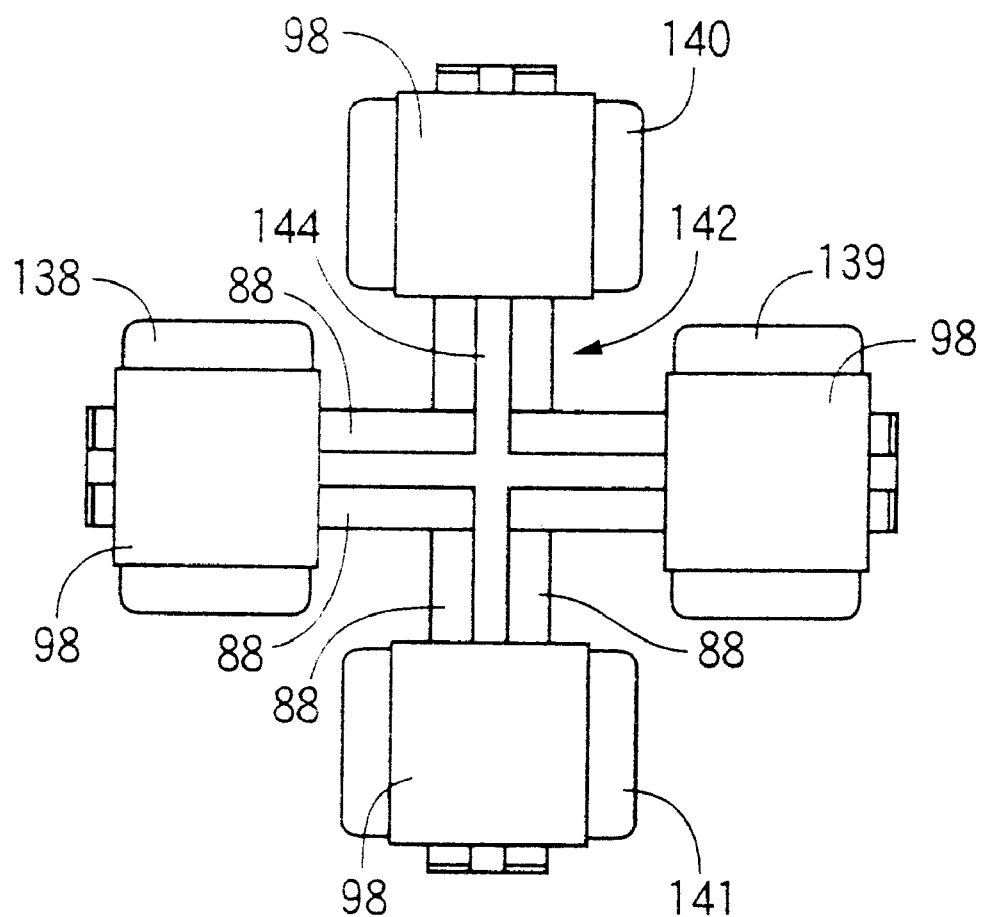
FIG. 12 is a bottom view of a linear-motor-driven chuck as a second embodiment of the present invention.

In the EC mounting system described above, the linear-motor-driven chuck 72 includes the two holding jaws 108, 109 for sandwiching the EC 134 in one direction and thereby holding the same 134. However, the chuck 72 may be replaced by a different linear-motor-driven chuck 142 shown in FIG. 12. The chuck 142 includes two linear motors 80 including four moving members 138, 139, 140, 141, two 138, 139 of which are moved toward, and away from, each other in a first direction, the other two 140, 141 of which are moved toward, and away from, each other in a second direction perpendicular to the first direction, and all of which cooperate with one another to hold an EC. The two linear motors include a common stator 144 having four arm portions which extend radially outward and are equiangularly spaced from one another about a vertical centerline of the chuck 142. Since the four moving members 138–141 may interfere with one another around the centerline of the chuck 142, the shapes and sizes of ECs that can be held by the chuck 142 are somewhat limited. However, in the case where each of the four moving members 138–141 has a shape overhanging or projecting toward the centerline, the chuck 142 can hold even an EC having a small size.

Two pairs of holding jaws 108, 109 are detachably attached to the two pairs of moving members 138–141, respectively. In this case, it is preferred that each of the four jaws 108, 109 be supported by a corresponding one of the four moving members 128–141, such that the each jaw 108, 109 is movable relative to the one moving member 138–141 in directions perpendicular to the directions in which the each jaw is moved with the one moving member, and be biased by a biasing member such that the each jaw is normally biased toward a neural position thereof. More specifically described, for example, the above-described attaching member 110 is attached to each of the four tables 98 of the chuck 142, such that the attaching member 110 is movable, owing to a stepped screw and an elongate hole, relative to the each table 98 in the directions perpendicular to the directions in which the corresponding pair of holding jaws 108, 109 are opened and closed, and a spring member as the biasing member biases the attaching member 110 toward its neutral position. In this case, when one pair of jaws 108, 109 hold an EC after the other pair of jaws 108, 109 have held the EC, the EC is allowed to be moved by a small distance by elastic deformations of the two spring members associated with the other pair of jaws 108, 109. Thus, in this case, it is not essentially required that the EC be simultaneously held by the two pairs of jaws 108, 109. That is, the EC may be held first by one pair of jaws and then by the other pair of jaws. In addition, in the state in which the EC is held by the two pairs of jaws, each of respective positions of the EC relative to the chuck 142 in the first and second directions may be changed or adjusted by moving a corresponding one or ones of the four moving members 138–141 relative to the stator 144.

In each of the illustrated embodiments, the control device 116 controls the respective electric currents supplied to the respective coil units of the two moving members 84, 86 or the four moving members 138–141, so that the two or four holding jaws 108, 109 hold an EC with a holding force suitable for the sort of EC while being kept still at the respective stopped positions. However, the control device 116 may be so modified as to control the respective positions of the two or four moving members 84, 86, 138–141 in such a manner that the two or four holding jaws 108, 109 are kept still at respective positions where the jaws 108, 109 first contact an EC.

It is to be understood that the present invention may be embodied with various changes, modifications, and improvements, such as those described in SUMMARY OF THE INVENTION, which may occur to a person skilled in the art, without departing from the spirit and scope of the invention defined in the appended claims.

What is claimed is:

1. A chuck for holding an object, comprising:
   at least one linear motor which includes at least one linear stator, two moving members which are movable along the linear stator, independent of each other, and at least one guide member which guides each of the two moving members along the linear stator; and
   two holding members which are supported by the two moving members, respectively, and which cooperate with each other to hold the object.

2. A chuck according to claim 1, further comprising a rotating device which rotates the linear motor about an axis line perpendicular to a lengthwise direction of the linear stator.

3. A chuck according to claim 1, wherein each of the two moving members comprises an attaching member to which a corresponding one of the two holding members is detachably attached.

4. A chuck according to claim 1, further comprising two position sensors each of which detects a current position of a corresponding one of the two moving members and produces a detection signal indicating the detected current position of said one moving member.

5. A chuck according to claim 1, further comprising two origin sensors each of which detects a corresponding one of the two moving members which is currently positioned at an origin position thereof.

6. A chuck according to claim 4, further comprising a control device including a symmetric-movement control portion which controls, based on the respective detection signals produced by the two position sensors, the linear motor to move the two moving members symmetrically with respect to a centerline of the chuck.

7. A chuck according to claim 4, further comprising a control device including an asymmetric-movement control portion which controls, based on the respective detection signals produced by the two position sensors, the linear motor to move the two moving members asymmetrically with respect to a centerline of the chuck.

8. A chuck according to claim 4, further comprising a control device including an object-dependent control portion which controls, based on the respective detection signals produced by the two position sensors, the linear motor to move the two moving members to respective opened positions where the two holding members supported by the two moving members are distant from each other by a distance greater than a prescribed dimension of the object by a predetermined distance and then move the two moving members toward each other at respective speeds equal to each other.

9. A chuck according to claim 6, further comprising a control device including an object-dependent control portion which controls, based on the respective detection signals produced by the two position sensors, the linear motor to move the two moving members to respective opened positions where the two holding members supported by the two moving members are distant from each other by a distance greater than a prescribed dimension of the object by a predetermined distance and then move the two moving members toward each other at respective speeds equal to each other.

10. A chuck according to claim 7, further comprising a control device including an object-dependent control portion which controls, based on the respective detection signals produced by the two position sensors, the linear motor to move the two moving members to respective opened positions where the two holding members supported by the two moving members are distant from each other by a distance greater than a prescribed dimension of the object by a predetermined distance and then move the two moving members toward each other at respective speeds equal to each other.

11. A chuck according to claim 1, further comprising a control device including a holding-force control portion which controls a holding force with which the two holding members hold the object.

12. A chuck according to claim 1, comprising two said linear motors one of which includes two first moving members that are movable toward, and away from, each other in a first direction and the other of which includes two second moving members that are movable toward, and away from, each other in a second direction perpendicular to the first direction, wherein the first and second moving members cooperate with each other to hold the object in the first and second directions.

13. A system for mounting at least one electric component on a circuit substrate, comprising:
    a chuck according to claim 1;
    a chuck moving device which moves the chuck to an arbitrary position in a movement area parallel to a substantially horizontal plane;
    a supplying device which is provided in the movement area and which supplies the electric component to the chuck; and
    a supporting device which is provided in the movement area and which supports the circuit substrate on which the electric component is to be mounted by the chuck.

14. A system according to claim 13, further comprising a chuck elevating and lowering device which elevates and lowers the chuck in respective directions perpendicular to the substantially horizontal plane.

15. A system according to claim 13, further comprising:
    an image taking device which takes an image of the electric component held by the chuck; and
    a modifying device which determines, based on image data representing the image taken by the image taking device, at least one positional error of the electric component held by the chuck and modifies, based on the determined positional error, at least one movement amount of the chuck moving device so as to move the chuck to a position where the positional error of the electric component is zero relative to the circuit substrate supported by the supporting device.

* * * * *